Figure 1:
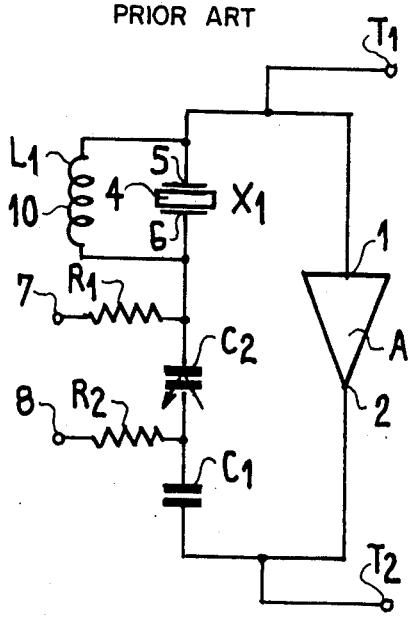

United States Patent [19]
Helle

[11] 4,063,194
[45] Dec. 13, 1977

[54] WIDE-BAND FREQUENCY-CONTROLLED CRYSTAL OSCILLATOR

[75] Inventor: Jacques Helle, Sartrouville, France

[73] Assignee: Compagnie d'Electronique et de Piezo-Electricite, Sartrouville, France

[21] Appl. No.: 738,593

[22] Filed: Nov. 3, 1976

[30] Foreign Application Priority Data

Nov. 7, 1975 France ............................... 75.34163

[51] Int. Cl.² ............................................. H03B 5/32
[52] U.S. Cl. ................................ 331/162; 331/116 R; 331/177 V
[58] Field of Search .................. 331/116 R, 158, 162, 331/177 V; 332/26

[56] References Cited

U.S. PATENT DOCUMENTS

| | | | |
|---|---|---|---|
| 3,358,244 | 12/1967 | Ho et al. | 331/162 X |
| 3,581,240 | 5/1971 | Enderby | 331/116 R X |

Primary Examiner—Siegfried H. Grimm
Attorney, Agent, or Firm—Cushman, Darby & Cushman

[57] ABSTRACT

An oscillator formed of an amplifier with a feedback loop containing two parallel connected crystals in series with a voltage variable capacitance. The two crystals have respective resonance frequencies above and below the limits of a wide band over which the oscillator frequency can be varied by a control voltage. Frequency versus control voltage linearity is improved by inductances inserted in parallel and in series, respectively, with the lower and higher frequency crystals.

4 Claims, 6 Drawing Figures

WIDE-BAND FREQUENCY-CONTROLLED CRYSTAL OSCILLATOR

This invention relates to a type of crystal oscillator of which the frequency may be controlled by an electrical voltage, which enables the operating frequency of the oscillator to be freely selected within a given band of frequencies. The oscillator consists essentially of an amplifier of which the output is connected to the input through a circuit comprising an oscillating piezoelectric crystal, the gain of the system with the feed back loop thus formed being higher than one, to satisfy the requirements of self-oscillation. This circuit generally comprises, connected in series with the crystal, reactance elements, such as auto-inductance or capacitances, the construction of at least some of which, in a form of adjustable value, enables the frequency supplied by the oscillator to be varied. One advantageous embodiment of a control capacitance may be formed by a type of diode which behaves like a capacitor, if it is biased by a so-called biasing voltage of suitable direction and magnitude. The variation in capacitance of a capacitor such as this, is obtained by applying a variable electrical voltage superimposed upon the biasing voltage. This variable voltage will be referred to hereinafter as control voltage or signal.

A parameter characteristic of the operation of an oscillator with a controlled electrical frequency is the curve which takes into account variations in the frequency F supplied in dependence upon the control voltage V applied to the electrically variable capacitor which will be designated by "e.v. capacitor" in the followings. This curve will be referred to hereinafter as the "characteristic curve".

In pratical applications, it is desirable that this curve should be substantially linear in the region of the service frequencies, which is normally obtained by connecting a selfinductance of suitable value in series with the crystal. An oscillator of this type was the subject of a French Patent Application filed by Applicants on Feb. 1, 1966 under the registration No. 47 984 and granted as a Patent under the No. 1,473,273.

The oscillator according to this Patent gives satisfactory results in the case of limited frequency excursions. If, depending upon the orders of magnitude given by way of example, variations of $\pm 10^{-4} F_o$ are made around the central frequency $F_o = 12\,000$ kHz, a highly linear variation, accurate to $10^{-4}$, is obtained with a negligible amplitude modulation of the high-frequency output signal, and a high stability of the oscillator of the order of $10^{-6}$.

However, in cases where it is desired to obtain a greater frequency excursion of the order of $\pm 10^{-3} F_o$, the simple circuit according to the above-mentioned Patent only provides for mediocre linearity with an accuracy of less than $10^{-2}$. In addition, the frequency of the oscillator is greatly affected by temperature, so that it is not possible to obtain a high level of stability.

The present invention is not attended by any of these disadvantages and provides a significant improvement in the results obtained by the controlled frequency oscillator to which it relates, according to the three characteristics parameters of excursion frequency, linearity, and stability.

The invention uses two piezoelectric crystals which are connected in parallel in the feedback circuit and of which the respective frequencies are respectively above and below the limits of the frequency excursion range to be covered by the control of frequency.

Two groups of elements having inductance and capacitance, one of the groups having its elements connected in parallel with the crystals and the other having its elements connected in series with the feedback circuit, ensure on the one hand the adjustement of the linearity of the variation in frequency in dependence upon the control voltage and, on the other hand, the adjustement of the desired value of this variation for a given variation in this voltage.

According to the invention, it is provided a wideband oscillator with electrical frequency control consisting on the one hand of an oscillating circuit in the form of a feedback loop comprising, in particular, an amplifier, a first element with variable reactance in dependence upon electrical quantities or signals, and a second oscillating element with a high Q-factor, wherein said second element is formed by two piezoelectric crystals connected in parallel through a connecting capacitor, these two crystals having resonance frequencies respectively above and below those of said wide-band.

The invention will be better understood from the following description in conjunction with the accompanying drawings, wherein:

FIG. 1 diagrammatically illustrates an oscillator according to the prior art.

Figure 2:
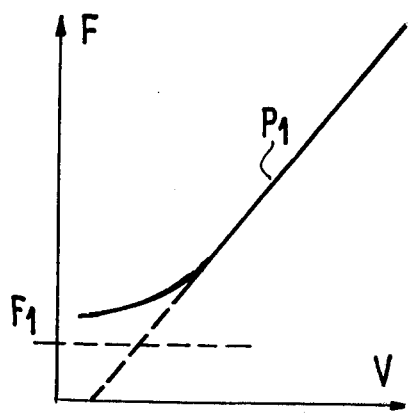

FIG. 2 is a cartesian graph explaining the operation of this oscillator.

Figure 3:
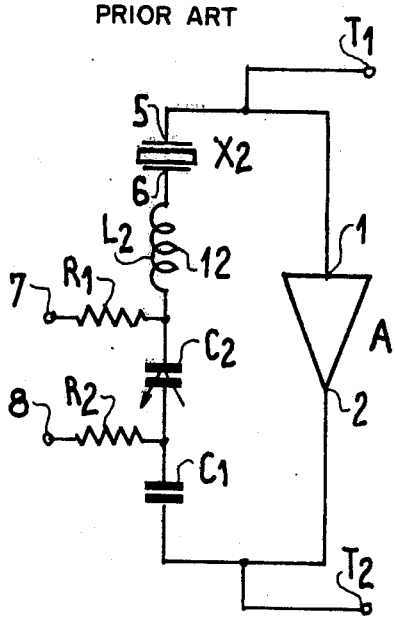

FIG. 3 diagrammatically illustrates another oscillator according to the prior art.

Figure 4:
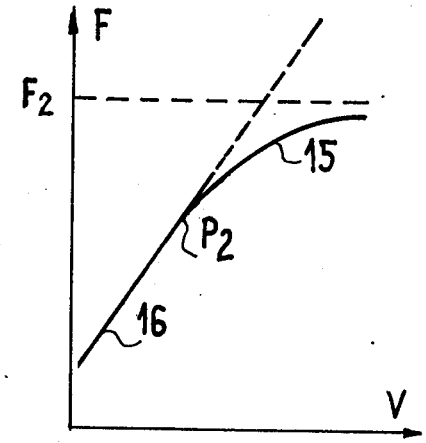

FIG. 4 is a cartesian graph explaining the operation of this oscillator.

Figure 5:
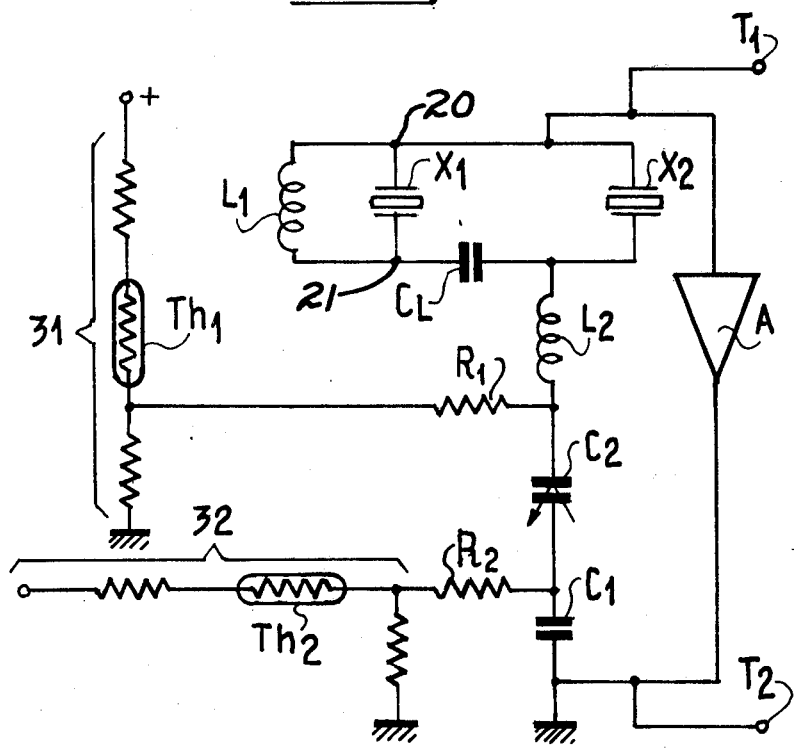

FIG. 5 diagrammatically illustrates the oscillator according to the invention.

Figure 6:
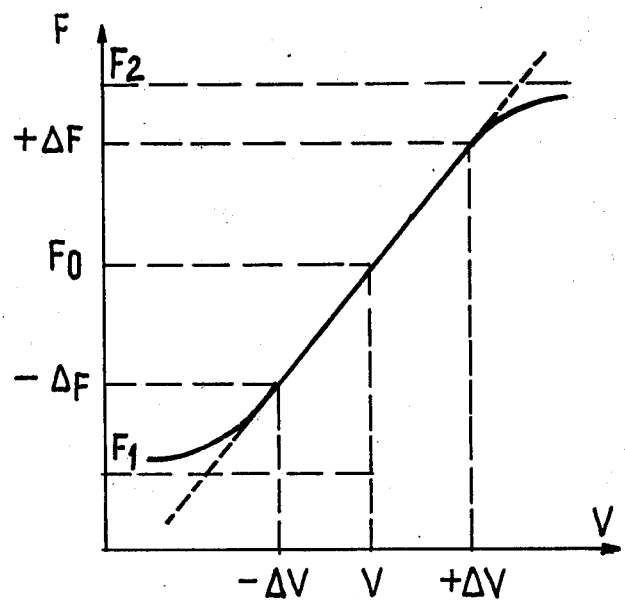

FIG. 6 is a cartesian graph explaining the operation of this oscillator.

FIG. 1 diagrammatically illustrates the circuit of a crystal oscillator according to the prior art designed to give a relatively large frequency excursion.

This circuit essentially comprises an amplifier A, diagrammatically illustrated without its feed sources for the sake of simplicity, of which the input 1 and the output 2 are connected together by way of a crystal 4 comprising electrodes 5 and 6, and two capacitors C1 and C2, the capacitance of C2 depending upon the electrical voltage applied between its two electrodes. A capacitor such as C2 will be designated, as already said, by "e.v. capacitor", although it may also be formed by any electrical component capable of having a variable capacitance in dependence upon an electrical voltage, such as a transistor for example.

In the case of capacitors of the "diode" type, the voltages V for controlling variation in capacitance are directly applied between the terminals and, in the embodiment illustrated in FIG. 1, are thus applied between the points 7 and 8 for the capacitor $C_2$. In order, in practice, to ensure that the sources of the necessary biasing voltage, whose inherent impedance is normally low, do not interfere with the operation of the oscillator circuit with its feedback loop which forms a circuit normally of high impedance, the biasing voltages are applied to the e.v. capacitor through highly valued resistors $R_1$ and $R_2$.

The useful oscillation voltage is collected between the terminals $T_1$ and $T_2$.

The increase in the excursion frequency is provided by the self-inductance $L_1$ 10 which is connected in parallel to the terminals of the crystal 4.

For a given gradient of the characteristic curve, determined by the choice of the e.v. capacitor $C_2$, good linearity of this curve is obtained by adjustement of the value of $L_1$.

However, this linearity is situated in a frequency range very much higher than the frequency $F_1$ of the crystal, with the result that the frequency stability of an oscillator such as this is not longer determined solely by the crystal, but also by the stability of the values of $L_1$, $C_1$ and $C_2$. The further the frequency supplied is from the frequency of the crystal, the more the influence of these elements increases and, since they have mediocre stability characteristics, especially in dependence upon temperature, the poorer is the stability of the oscillator.

FIG. 2 shows the characteristics curve corresponding to a circuit of the type in question in axes of cartesian coordinates where the voltage V applied to the e.v.c. $C_2$ is recorded on the abscissa and the corresponding frequency F on the ordinate. This graph shows that the entire characteristic curve $P_1$ is situated in a frequency range above the inherent frequency $F_1$ of the crystal $X_1$ with the disadvantages referred to earlier on.

FIG. 3 diagrammatically illustrates a crystal oscillator which uses another known means for obtaining a significant frequency excursion. The elements common to this Figure and to FIG. 1 are denoted by the same reference numerals, and the increase in the frequency excursion is provided by the insertion, in series with the crystal 4, of a self-inductive $L_2$ 12.

FIG. 4 illustrates the result of an arrangement such as this on the corresponding characteristic curve in the same coordinate axes as those of FIG. 2.

In this case, after a first region 15 with a significant radius of curvature, the characteristic curve shows a steep, substantially constant gradient at 16. It is situated very distinctly at frequencies below the inherent frequency $F_2$ of the crystal with the same adverse effects as in the first case described earlier on upon the stability of the oscillator.

FIG. 5 is a diagrammatically view of the oscillator according to the invention. In terms of its overall structure, this oscillator is the result of the combination of the two circuits described above.

With the same elements as in the preceding Figures bearing the same reference numerals, this oscillator circuit comprises, on the one hand, in its feedback circuit or loop, two crystals $X_1$ and $X_2$ connected in parallel through a capacitor $C_L$, the whole being inserted in series into the feedback loop.

On the other hand, a self-inductance $L_1$ is connected to the common terminals 20 and 21 of the crystals, whilst a self-inductance $L_2$ is inserted in series into the feedback loop.

The Figure also shows the supplementary circuits 31 and 32 which ensure, on the one hand, biasing of the e.v.c. $C_2$ and, on the other hand, application of the frequency control voltage. Since these supplementary circuits are known, they will not be described in detail here. However, the introduction of temperature-sensitive correcting elements, the thermistors Th1 and Th2, will be noted, these elements being intended to improve the operating stability of the circuit in dependence upon variations in temperature.

FIG. 6 is a graph explaining the operation of an oscillator circuit of this type. The characteristic curve (V, F) corresponding to the circuit according to the invention described earlier on, is shown in axes of cartesian coordinates with the same values recorded on these axes as in FIGS. 2 and 4.

The characteristic curve is a combination, without any discontinuity, of the two curves of FIGS. 2 and 4.

The central frequency $F_o$ is situated between the two inherent frequencies of the crystals $F_1$ and $F_2$. Accordingly, when the frequency excursion being established approaches one of these upper or lower limits, the corresponding crystal, through its stability, limits the troublesome influence of the elements $L_1$ and $L_2$, $C_1$ and $C_2$ in the same region of the curve.

On the other hand, excellent continuity of the gradient in the vicinity of the frequency $F_o$ may readily be obtained by a precise choice of the value of the coupling capacitance $C_L$ between the two crystals.

Finally, the other operating parameters may be defined by a suitable choice of the electrical characteristics of $L_2$ and $L_1$, of which analysis of their respective functions may be carried out on the known circuits shown in FIGS. 1 and 3.

The oscillator according to the invention thus provides, with excellent stability and linearity, for the delivery of an alternating signal of which the frequency may be controlled between extreme frequency limits which may be ten times wider than those relative to a conventional e.v. capacitor oscillator.

In one practical embodiment, and depending upon the typical values given by way of example, for a central frequency Fo of 12 500 khz, the oscillator circuit according to the invention equipped with two crystals resonating at 12 485 kHz and 12 523 kHz, respectively, produced a frequency excursion of ±10 kHz, with a linearity of ±2 %, in a temperature range from − 55° C to 90° C.

Of course the invention is not limited to the embodiment described and shown which was given solely by way for example.

What is claimed is:

1. A wide-band frequency-controlled crystal oscillator, consisting, of an oscillating circuit in the form of a feedback loop, comprising an amplifier (A), a first element ($C_2$) having variable reactance in dependence upon electrical quantities or signals, and a second element oscillating with a high Q-factor, wherein said second element is formed by two piezoelectric crystals ($X_1$) ($X_2$) connected in parallel through a connecting capacitor ($C_l$), these two crystals having resonance frequencies respectively above the below those of said wide band.

2. A wide-band oscillator as claimed in claim 1, wherein said first element is a diode of the electrically variable capacitance type.

3. A wide-band oscillator as claimed in claim 1, wherein the piezoelectric crystal of lower resonance frequency is connected in parallel with a self-inductance.

4. A wide-band oscillator as claimed in claim 1, wherein the piezoelectric crystal of higher resonance frequency is connected in series with a self-inductance, their common junction point being connected to said connecting capacitor.

* * * * *